United States Patent
Watarai

(10) Patent No.: US 6,329,866 B1
(45) Date of Patent: Dec. 11, 2001

(54) TRANSIENT CURRENT PRODUCING METHOD, TRANSIENT CURRENT PRODUCING CIRCUIT, RELATED SEMICONDUCTOR INTEGRATED CIRCUIT AND LOGICAL CIRCUIT

(75) Inventor: Seiichi Watarai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,075

(22) Filed: Jan. 27, 2000

(30) Foreign Application Priority Data

Jan. 29, 1999 (JP) .................................................. 11-022764

(51) Int. Cl.[7] ............................................................. H03K 17/16
(52) U.S. Cl. ............................. 327/379; 327/310; 327/389
(58) Field of Search .................................... 327/379, 380, 327/389, 310, 381, 383, 384, 391, 313, 112, 120, 108; 326/26, 27

(56) References Cited

U.S. PATENT DOCUMENTS

| | | | |
|---|---|---|---|
| 4,947,063 | * | 8/1990 | O'Shaughnessy .................... 327/384 |
| 5,237,395 | * | 8/1993 | Lee ........................................ 257/385 |
| 5,451,861 | * | 9/1995 | Giebel ................................... 323/315 |
| 5,537,067 | * | 7/1996 | Carvajal et al. ...................... 327/108 |
| 6,051,995 | * | 4/2000 | Pollacheck ............................. 326/87 |

FOREIGN PATENT DOCUMENTS

| | | |
|---|---|---|
| 62-284524 | 12/1987 | (JP) . |
| 3-106221 | 5/1991 | (JP) . |
| 7-162284 | 6/1995 | (JP) . |
| 7-235868 | 9/1995 | (JP) . |
| 8-265123 | 10/1996 | (JP) . |

* cited by examiner

Primary Examiner—Kenneth B. Wells
Assistant Examiner—Hiep Nguyen
(74) Attorney, Agent, or Firm—McGuireWoods LLP

(57) ABSTRACT

A transient current producing method, a transient producing circuit, a related semiconductor integrated circuit and logical circuit are provided, which are capable of preventing a flow of a steady state current, consuming little power and switching at high speed. A transient current occurring at a time of switching of a CMOS circuit is amplified to a predetermined value. This amplification prevents the flow of the steady state current in the circuit. The transient current occurring at the time of switching of the CMOS circuit is converted to a transient voltage. The conversion of the transient current to the transient voltage having a predetermined value and the amplification of the transient current allow a simple configuration of the circuit. The transient current is a feedthrough current which flows from a terminal of a power supply to a ground at the time of switching of the CMOS circuit. The transient current can be a transient current which flows from the power supply to an output terminal of the CMOS circuit at the time of switching of the CMOS circuit and also can be a transient current which flows from the output terminal to the ground.

29 Claims, 8 Drawing Sheets

TRANSIENT CURRENT PRODUCING METHOD, TRANSIENT CURRENT PRODUCING CIRCUIT, RELATED SEMICONDUCTOR INTEGRATED CIRCUIT AND LOGICAL CIRCUIT

BACKGROUND OF THE INVENTION

1. Field of the Invention

The present invention relates to a transient current producing method, transient current producing circuit, related semiconductor integrated circuit and logical circuit in a high-speed operation logical circuit and more particularly to the transient current producing method, transient current producing circuit, related semiconductor integrated circuit and logical circuit to implement high-speed switching operations and low power consumption.

2. Description of the Related Art

In a high speed logical circuit, to ensure its high speed operation, in the case of large load capacity in particular, a method is utilized in which its loaded capacity is charged and discharged at high speed by producing a transient current. FIG. 7 is an example of a conventional logical circuit containing a transient current producing circuit (which is also called an "active pull-down or active pull-up circuit" in some cases).

As shown in FIG. 7, a drain of a p-channel MOS transistor 1 (hereinafter referred to as a "PMOS transistor") is connected to a drain of an n-channel MOS transistor 2 (hereinafter referred to as an "NMOS transistor"), to a gate of the NMOS transistor 3, to a base of an NPN-type bipolar transistor 6 (hereinafter referred to as an "NPN transistor") through a resistor 4 and to a collector of the NPN transistor 6 through a resistor 5, and a source of the PMOS transistor 1 is connected to a terminal of a power supply VDD, sources of the NMOS transistors 2 and 3 and an emitter of the NPN transistor 6 are connected to the ground, a capacitor device 7 is connected between the base of the NPN transistor 6 and the ground, gates of both the PMOS transistor 1 and the NMOS transistor 2 are connected to an input IN, a drain of an NMOS transistor 3 is connected to an output OUT.

A first CMOS circuit 8 is composed of the PMOS transistor 1 and the NMOS transistor 2. A second CMOS circuit is composed of the NMOS transistor 3. A transient current producing circuit 10 is comprised of the resistors 4 and 5, the NPN transistor 6. Also, the output OUT is connected through a terminating resistor RTT to a terminal of a terminating voltage VTT. The logical circuits shown as examples are generally called an output circuit which is used to output a logical signal through a transmission line such as a bus line connected among two or more integrated circuits.

FIG. 8 is the timing chart showing operations of logical circuits containing the transient current producing circuit 10 shown in FIG. 7. In FIG. 8, during a section A where the input IN is at the same potential as the terminal of the power supply VDD and at a high level, an output (node A) of the CMOS circuit 8 is at the same potential as the ground and at a low level and the NPN transistor 6 is in an OFF state.

Since the NMOS transistor 3 remains in its OFF state, the output OUT is at the same potential as the terminating power supply VTT and at a high level. After that, if a level of the input IN becomes low, though the PMOS transistor 1 is changed to be in its ON state during a section B, causing currents to be supplied to the resistor 4, and the base of the NPN transistor 6 is delayed, by time constant of the resistors 4 and capacitor device 7 (the time period "t1" in FIG. 8), in being turned ON.

The current of the PMOS transistor 1 during a period existing before the NPN transistor 6 is turned ON is only a current supplied to the gate of the NMOS transistor 3 by the NMOS transistor 3 and, therefore, a transition of the NMOS transistor from its OFF state to its ON state is speeded up.

A time "t1" after, the NPN transistor 6 is turned ON and a potential of the node A is clamped to a predetermined value. At this point, a steady state current flows from the terminal of the power supply VDD through the PMOS transistor 1, a resistor 5 and the NPN transistor 6 towards the ground. In this state, since the NMOS transistor 3 is in its ON state, a current flows from the terminal of the terminating power supply VTT through a terminating resistor RTT to the NMOS transistor 3. As a result, the potential of the output OUT drops by the current flowing from the terminal of the terminating power supply VTT to the terminating resistor, which is at a low level. After that, when the input IN again changes to a high level, though the PMOS transistor 1 changes to its OFF state during a section C and the NMOS transistor 2 changes to its ON state, since the NPN transistor is turned ON, the level of the node A rapidly becomes low. Accordingly, the NMOS transistor 3 changes to be in its OFF state.

In such logical circuits for producing logic signals described above, a reaction current always occurs and therefore the transient producing circuit serving as a discharging circuit to discharge such reaction currents is required. However, in the circuit having such a transient producing circuit, a current flows constantly during a rising period due to its time constant, causing a delay in switching among circuits. During the section B in FIG. 8, the NPN transistor 6 in the transient current producing circuit always remains ON, causing a steady state current to continue flowing, thus resulting in an increase in power consumption. Because of this increase in the power consumption, it is difficult to use the high-speed logical circuit described above in such applications as battery driving and the like where low power consumption is necessarily required. Accordingly, the logical circuit capable of preventing the flow of the steady state current, consuming little power and switching at high speed is strongly needed.

SUMMARY OF THE INVENTION

In view of the above, it is an object of the present invention to provide a transient current producing method, a transient producing circuit, a related semiconductor integrated circuit and logical circuit, which are capable of preventing a flow of a steady state current, consuming little power and switching at high speed.

According to a first aspect of the present invention, there is provided a method for producing a transient current including a step of amplifying the transient current occurring at a time of switching of a CMOS circuit wherein the amplification of the transient current prevents a flow of a steady state current in the circuit.

According to a second aspect of the present invention, there is provided a method for producing a transient current including steps of converting the transient current occurring at the time of switching of a CMOS circuit to a transient voltage, and converting the transient voltage to a transient current having a predetermined value and amplifying the transient current, wherein the amplification of the transient current serves to allow construction of a simple circuit.

In the foregoing, a preferable mode is one wherein the transient current is a feedthrough current flowing from a power supply to a ground at the time of switching of the CMOS circuit.

Also, a preferable mode is one wherein the transient current is a transient current flowing from the power supply to an output terminal of the CMOS circuit at the time of switching of the CMOS circuit or a transient current flowing from the output terminal to the ground.

According to a third aspect of the present invention, there is provided transient current producing means including:
  a CMOS circuit;
  a transient voltage converting means for converting the transient current occurring at the time of switching of the CMOS circuit to the transient voltage; and
  the transient current producing means for converting the transient voltage to the transient current having a predetermined value and for amplifying the current, wherein the amplification of the transient current prevents a flow of a steady state current.

In the foregoing, a preferable mode is one wherein the transient voltage producing means is connected between the CMOS circuit and the power supply.

Also, a preferable mode is one wherein the transient voltage producing means is connected between the CMOS circuit and the ground.

Also, a preferable mode is one wherein the transient voltage producing means is a resistor or a resistance component of a transistor against conduction.

According to a fourth aspect of the present invention, there is provided transient current producing means including:
  a first CMOS circuit;
  transient voltage converting means for converting a transient current to a transient voltage; and
  transient current amplifying means for converting the transient voltage to a transient current having a predetermined value and for amplifying the transient current.

In the foregoing, a preferable mode is one that wherein includes a second CMOS circuit and wherein the transient voltage producing means is used to convert the transient current flowing through the CMOS circuit which is switched at the same time or at almost the same time when the first CMOS circuit is switched, to a transient voltage.

Also, a preferable mode is one wherein the transient voltage producing means is provided with a resistor connected between the second CMOS circuit and the power supply.

Also, a preferable mode is one wherein the transient voltage producing means is provided with a resistor connected between the second CMOS circuit and the ground.

Also, a preferable mode is one wherein the resistor is a resistor device or a resistance component of a transistor against conduction.

Also, a preferable mode is one wherein an output signal from the transient voltage producing means is fed to an input terminal of the transient current amplifying means and wherein an output terminal of the transient current amplifying means is connected to the power supply or the ground and wherein the amplified transient current is instantaneously outputted from the output terminal and the steady state current does not flow.

Also, a preferable mode is one wherein an output signal of the transient voltage producing means is fed to an input terminal of the transient current amplifying means and an output terminal of the transient current amplifying means is connected through a resistor to the power supply or the ground and the amplified transient current is instantaneously outputted from the output terminal.

Also, a preferable mode is one wherein the CMOS circuit is provided with a bipolar transistor and a base of the bipolar transistor is used as the input of the CMOS circuit and an emitter of the bipolar transistor is connected through the resistor to the power supply or the ground.

Also, a preferable mode is one wherein the CMOS circuit is provided with a bipolar transistor and a gate of the unipolar transistor is used as the input of the CMOS circuit, a drain of the unipolar transistor is used as the output of the CMOS circuit and a source of the unipolar transistor is connected through the resistor to the power supply or the ground.

According to a fifth aspect of the present invention, there is provided a semiconductor integrated circuit including:
  a first CMOS circuit;
  transient voltage producing means for converting a transient current occurring at a time of switching of the first CMOS circuit to a transient voltage;
  transient current amplifying means for receiving the transient voltage and amplifying the transient current to a predetermined value; and
  logical circuits to receive an output signal from the first CMOS circuit and an output signal from the transient current amplifying circuit, which allows the formation of logical circuits operating at a high speed and consuming little current.

In the foregoing, it is preferable that the transient voltage producing means is connected between the first CMOS circuit and the power supply.

Also, it is preferable that the transient voltage producing means is connected between the first CMOS circuit and the ground.

Also, it is preferable that the transient voltage producing means is a resistor device or a resistance component of a transistor.

According to a sixth aspect of the present invention, there is provided a semiconductor integrated circuit including:
  a first CMOS circuit;
  transient voltage producing means for converting a transient current to a transient voltage;
  transient current amplifying means for receiving the transient voltage and amplifying the transient current to a predetermined value; and
  logical circuits to receive an output signal from the first CMOS circuit and an output signal from the transient current amplifying means.

Also, a preferable mode is one that wherein includes a second CMOS circuit and wherein the transient voltage producing means is used to convert a transient current flowing through the second CMOS circuit which is switched at the same time or at almost the same time when the second CMOS circuit is switched, to a transient voltage.

Also, a preferable mode is one wherein the transient voltage producing means is provided with a resistor connected between the second CMOS circuit and the power supply.

Also, a preferable mode is one wherein the transient voltage producing means is provided with a resistor connected between the second CMOS circuit and the ground.

Also, a preferable mode is one wherein the resistor is a resistor device or a resistance component of a transistor.

Also, a preferable mode is one wherein an output signal of the transient voltage producing means is fed to an input terminal of the transient current amplifying means, an output terminal of the transient current amplifying means is connected to the power supply or the ground and the amplified transient current is outputted from the output terminal.

Also, a preferable mode is one wherein an output signal of the transient voltage producing means is fed to an input terminal of the transient current amplifying means, an output terminal of the transient current amplifying means is connected through the resistor to the power supply or the ground and the amplified transient current is outputted from the output terminal.

Also, a preferable mode is one wherein the CMOS circuit is provided with a bipolar transistor and a base of the bipolar transistor is used as the input of the CMOS circuit, a collector of the bipolar transistor is used as the output of the CMOS circuit and an emitter of the bipolar transistor is connected through the resistor to the power supply or the ground.

Also, a preferable mode is one wherein the CMOS circuit is provided with a unipolar transistor and a gate of the unipolar transistor is used as the input of the CMOS circuit, a drain of the unipolar transistor is used as the output of the CMOS circuit and a source of the unipolar transistor is connected through the resistor to the power supply or the ground.

Also, a preferable mode is one wherein the logical circuit is the CMOS circuit formed by the unipolar transistors.

Also, a preferable mode is one wherein the logical circuit is formed by the bipolar transistor.

Also, a preferable mode is one wherein the logical circuit is a BiCMOS (Bipolar Complementary Metal Oxide Semiconductor) circuit composed of the unipolar or bipolar transistor formed on the same substrate.

Also, a preferable mode is one wherein both the first CMOS circuit and the second CMOS circuit are disposed on the same chip formed on the same substrate.

According to a seventh aspect of the present invention, there is provided a logical circuit for forming a logical signal used for the method and means for producing transient current including a transistor used to amplify a reaction current occurring at the time of switching and to discharge it.

In the foregoing, it is preferable that the logical circuit includes a voltage circuit to produce the reaction current occurring at the time of switching of the transistor;

amplifying means for amplifying the reaction current produced by the reaction voltage;

a first resistor to produce the reaction voltage; and a second resistor contained in the amplifying means;

whereby the first and second resistors are connected to a terminal having the same potential and wherein a relation between a resistance R1 of the first resistor and a resistance R2 of the second resistor is able to be expressed in following formula:

$$R1=\alpha \cdot R2$$

where α represents a constant value at which the transient current value being a discharging value does not vary due to changes of resistance.

Also, it is preferable that the first and second resistors are disposed in proximity to each other on the same chip.

Also, it is preferable that the amplification is carried out for speeding up the switching.

Furthermore, it is preferable that the amplification is carried out for reducing current consumption.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
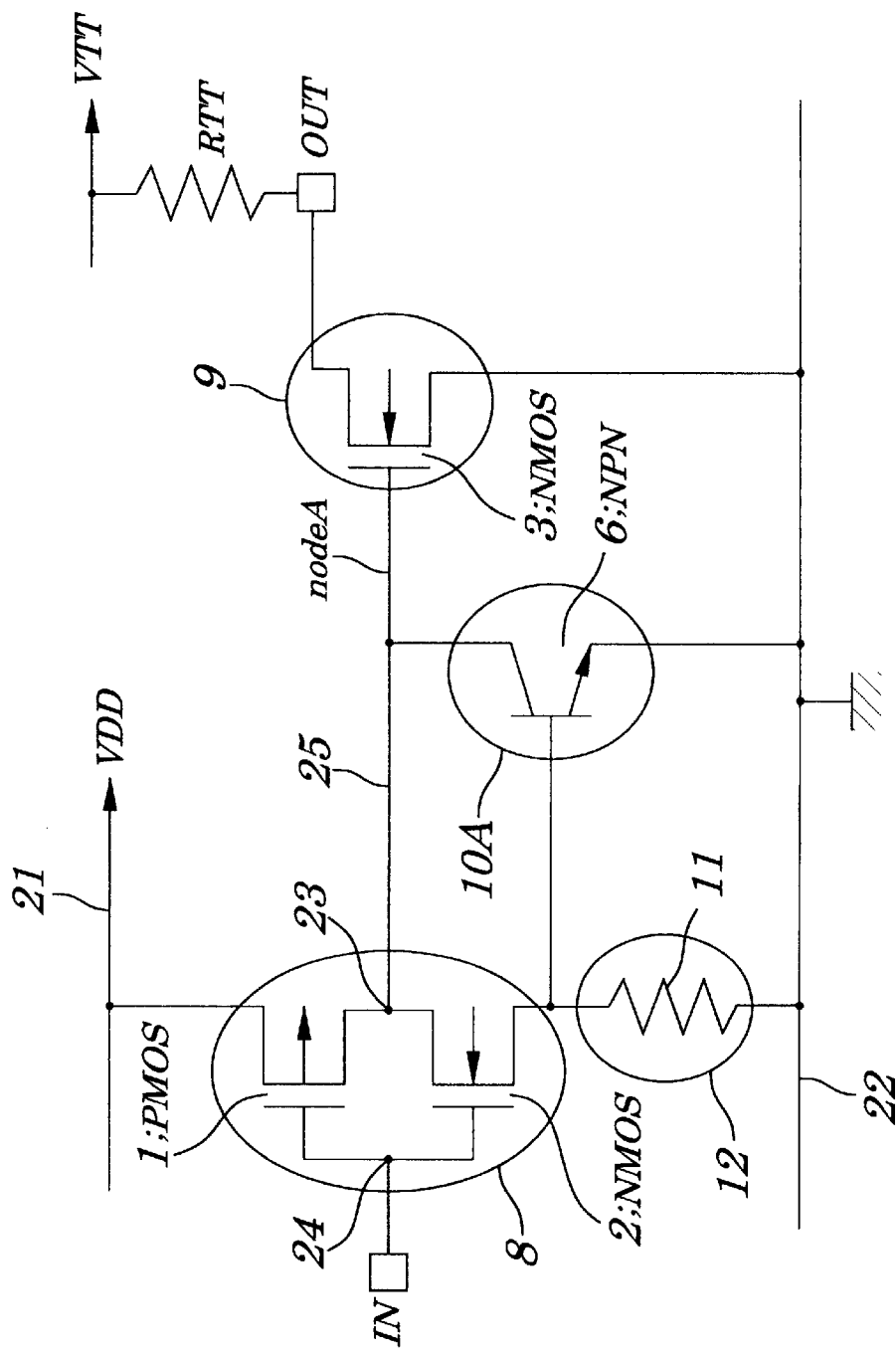
FIG. 1 is a schematic logical circuit diagram for implementing a transient current producing method, a transient current producing circuit and a semiconductor integrated circuit according to a first embodiment of the present invention.

FIG. 1 is a schematic logical circuit diagram for implementing a transient current producing method, a transient current producing circuit, a semiconductor integrated circuit and logical circuit according to a first embodiment of the present invention.

The logical circuit is output-type circuit composed of a first CMOS circuit 8, a second CMOS circuit 9 and a transient current amplifying circuit 10A being a discharging circuit, and which are disposed between a power supply terminal 21 and a grounding line 22. The power supply terminal 21 is connected to a power source VDD.

The first CMOS circuit 8 is composed of a PMOS transistor 1 and an NMOS transistor 2. A source of the PMOS transistor 1 is connected to the power supply terminal 21. A drain of the PMOS transistor 1 and a drain of the NMOS transistor 2 are connected through a common point 23, which are connected in series. A source of the NMOS transistor 2 is indirectly connected to a transient current amplifying circuit 10A to a grounding line 22. The transient voltage producing circuit 12 may be composed of a single resistor 11. Gates of both the PMOS transistor 1 and the NMOS transistor 2 are connected to a common point 23 of the gates.

A second CMOS circuit 9 is composed of a single NMOS transistor 3. A drain of the NMOS transistor 3 is connected to an output terminal OUT. A source of the NMOS transistor 3 is connected to a grounding line 22. A gate of the NMOS transistor is connected through a logical signal producing line (node A line) 25 to the common point 23 of the drain.

A transient current amplifying circuit 10A is composed of a single NPN transistor 6. A collector of the NPN transistor 6 is connected to the logical signal producing line 25. An emitter of the NPN transistor 6 is connected to the grounding line 22. A base of the NPN transistor 6 is connected to the source of the NMOS transistor 2, i.e., to a high voltage side of the resistor 11. The common point 24 of the gate is connected to an input terminal IN. The output terminal OUT is connected through a terminating resistor RTT to a terminal for terminating voltage VTT.

Figure 2:
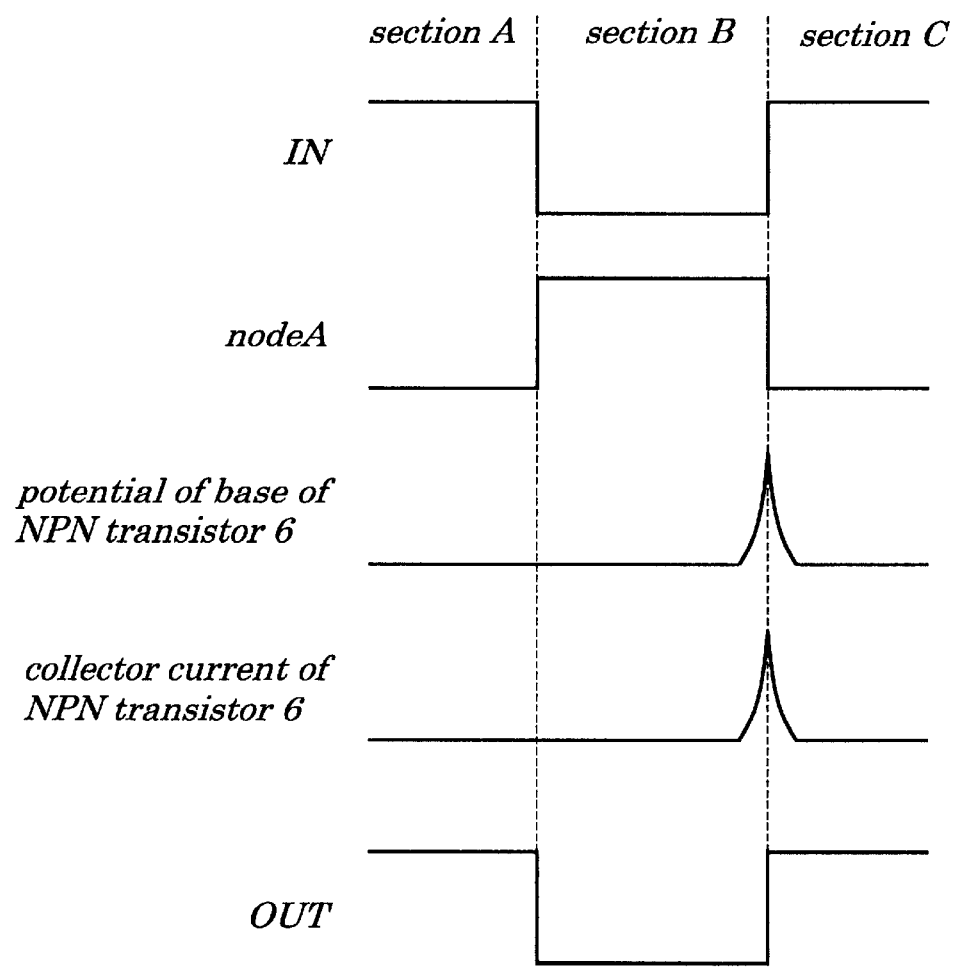
FIG. 2 is a timing chart showing operations of logical circuits according to the first embodiment of the present invention.

FIG. 2 is a timing chart showing operations of the logical circuit containing the transient current amplifying circuit 10A. If the input IN is at the same potential as the power supply voltage VDD and is at a high level, the PMOS transistor 1 is in its OFF state during a section A, an output (node A) of the first CMOS circuit 8 is at the same potential as a grounding potential and is at a low level, and the NPN transistor 6 is in its OFF state. Since the NMOS transistor 3 is also at its OFF level, a high level output having the same potential as the terminating resistor RTT is outputted from the output terminal OUT.

Next, during a section B in FIG. 2, when the level of the input IN becomes low, the PMOS transistor 1 is switched to its ON position. At this point, the NPN transistor 6 remains in its OFF state and a current from the PMOS transistor 1 is fed to a gate of the NMOS transistor. By the supply of the current, the NMOS transistor 3 changes rapidly from its OFF to ON state. A voltage (low level) which has dropped by a current flowing from the terminal for the terminating voltage to the terminating resistor RTT is outputted.

Further, when the input IN again goes high, as shown during a section C in FIG. 2, the PMOS transistor 1 is switched to its OFF position and the NMOS transistor 2 is switched to its ON position. During the section B in FIG. 2, the NMOS transistor 2 starts discharging to supply an electric charge accumulated in the node A to the grounding line 22. At this point, to the resistor 11 flows a transient current produced by the electric charges, resulting in supply of the transient current to the base of the NPN transistor 6. The supply of the transient voltage causes the NPN transistor 6 to instantaneously pass a transient current and to rapidly make the NMOS transistor 3 changed to its OFF state. This ON action causes the node A to rapidly be changed to its low level state. Accordingly, the NMOS transistor 3 is rapidly changed to its OFF state.

The current flowing through the NPN transistor 6 does not exist during the section B and occurs only at the instant of a shift in time from the section B to C. The transient current occurring at the instant can be set to any value by calibrating a resistance of the resistor 11. It is possible to greatly reduce power consumption by the calibration of the resistance of the resistor 11 and also to change the NMOS transistor to its OFF state at high speed by amplification of the transient current.

The resistor 11 constituting the transient voltage producing circuit 12 in FIG. 1 is formed as a semiconductor on a substrate as in other devices. In this case, resistance values of the resistor 11 change due to an influence of variations in manufacturing conditions in the manufacturing process of semiconductors. Moreover, the resistance values change due to variations in environment temperatures of a device on which the semiconductor is mounted.

The transient current produced by the transient current amplifying circuit 10A in FIG. 1 and influenced by variations in the resistance value of the resistor 11, can be expressed in the following formula:

$$IC = IS \cdot \exp(ID \cdot R11/VT) \tag{1}$$

where IC represents transient current produced by the transient current amplifying circuit 10A, R11 represents the resistance value R11 of the resistor constituting the transient voltage producing circuit 12, IS represents saturation current density, ID represents a drain current of the NMOS transistor 2, and VT represents a thermal voltage.

The voltage called a "thermal voltage" is known to become 26 mV at an ordinary temperature (300 K) and is expressed in the following formula:

$$VT = q/kT$$

where
"q" represents an electric charge of one electron,
"k" represents the Boltzmann's constant, and
"T" represents an absolute temperature.

In order to know the influence of variations in the resistance value of the resistor R11 in the formula (1), the formula (1) is differentiated with the resistance value of the resistor 11.

$$dIC1/dR11 = (ID/VT) \cdot IS \cdot \exp(ID \times R11/VT), dIC1/dR11 = (ID/VT) \times IC1 \tag{2}$$

That is, the transient current IC1 varies in proportion to ID/VT and IC1. This means that the time required to change the NMOS transistor 3 in FIG. 1 to its OFF state, in some cases, the switching of the NMOS transistor 3 to the OFF state is delayed greatly.

Second Embodiment

Figure 3:
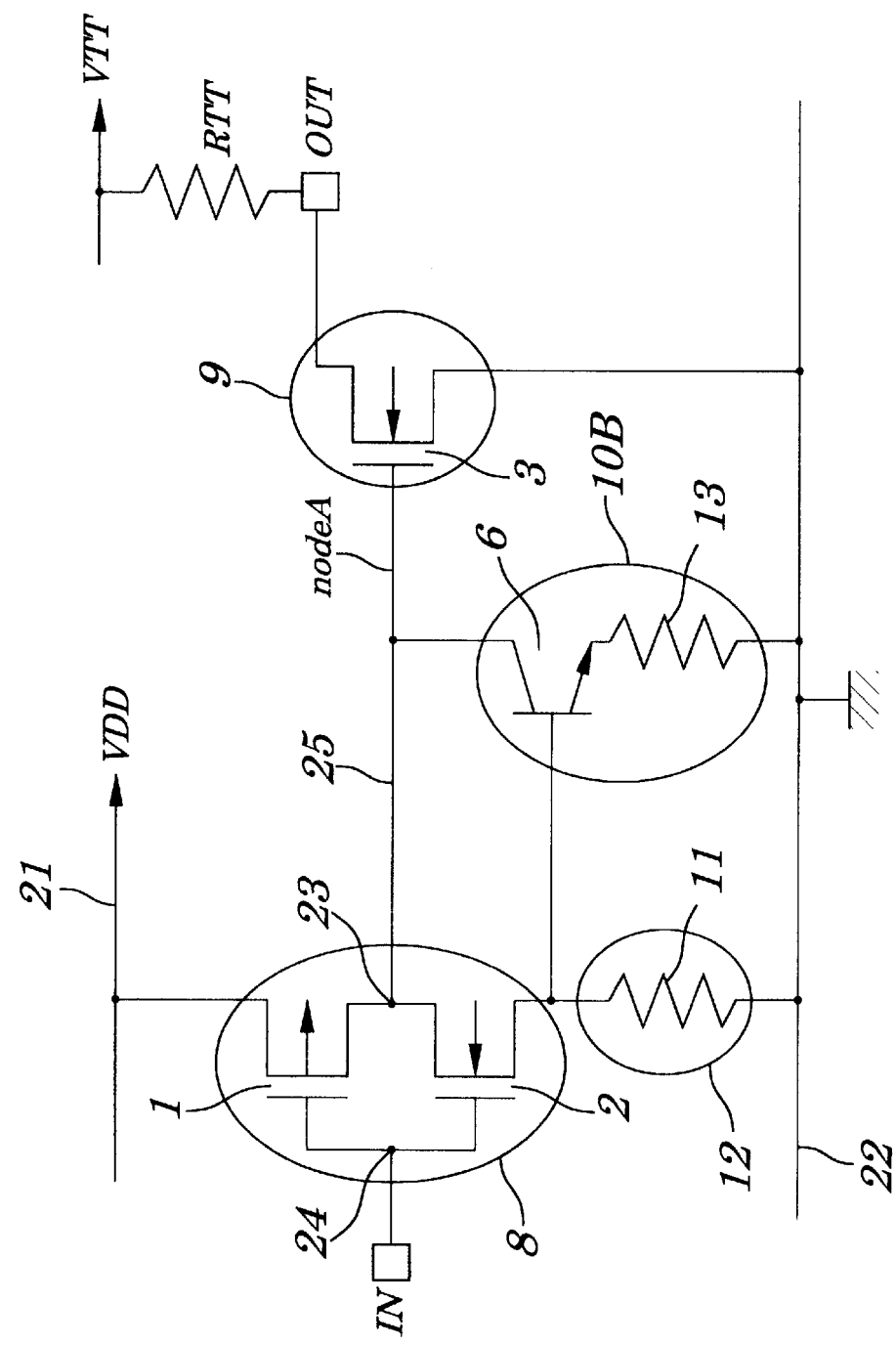
FIG. 3 is a schematic logical circuit diagram for implementing a transient current producing method, a transient current producing circuit and a semiconductor integrated circuit according to a second embodiment of the present invention.

FIG. 3 is a schematic logical circuit for implementing a transient current producing circuit according to a second embodiment of the present invention to solve problems of variations in time and a delay in switching of a transistor to its OFF state. According to the second embodiment, as shown in FIG. 3, a new resistor 13 is inserted between the NPN transistor 6 and the grounding line 22. The configurations of the circuits in FIG. 3 are the same as those in FIG. 1 except the new resistor 13 inserted therein. The resistor 13 is so inserted as to remove influences of variations in the resistance value of the resistor 11 and therefore operations of the transient current amplifying circuit 10B are the same as in the first embodiment.

In order for the transient current amplifying circuit 10B composed of the NPN transistor 6 and the resistor 13 to be able to output a transient current, the following formula must be satisfied.

$$ID \times R11 > R13 \times IC1 + VBE6 \tag{3}$$

R13: Resistance value of the resistor 13
VBE6: Voltage between a base and an emitter of the NPN transistor The formula (3) shows that it is necessary that the transient voltage produced by the resistor 11 constituting the transient voltage producing circuit 12 is larger than a level that can turn ON the NPN transistor 6 at a final stage. The relation between the resistor R11 and the transient current IC1 are derived from the formula (3) as follows:

$$ID \times R11 = R13 \cdot IC1 \cdot VT \cdot \ln(IC11/IS), IC11 = IS \cdot \exp\{(ID \cdot R11 - IC11 \cdot R13)/VT\} \tag{4}$$

If the resistors R11 and R13 are of the same type resistor produced on the same semiconductor substrate, since their tendencies to vary are the same, the following equation can be obtained:

$$R13 = \alpha \cdot R11 \quad (5)$$

The following formula can be further obtained by the formula (5) into the formula (4):

$$IC11 = IS \cdot \exp\{(ID - \alpha \cdot IC11) \cdot R11 / VT\} \quad (6)$$

In order to know the influence caused by variations in the resistance value of the resistor 11 in FIG. 6, the formula (6) is differentiated with the resistance value of the resistor R11 as follows:

$$dIC1/dR11 = \{(ID - \alpha \cdot IC11)/VT\} \cdot IC11 \quad (7)$$

In the formula (7), in order to remove the variations in the resistor R11, the following formula must be satisfied.

$$\alpha = ID/IC11 \quad (8)$$

That is, by selecting an appropriate resistance ratio between the resistors R11 and R13 so that the formula (8) is satisfied, the variations in the transient current against those in the resistance of the resistor R11 can be removed. The setting of the value "α" is made very easy, i.e., for example, by combining the resistors of the same shape in series or in parallel. To obtain an unknown IC11 from the known ID by using the formula (8), the value "α" to be a target value is first obtained and then calculations by trial and error are performed by setting values of the resistors R11 and R13 that can satisfy the formula (3).

Third Embodiment

Figure 4:
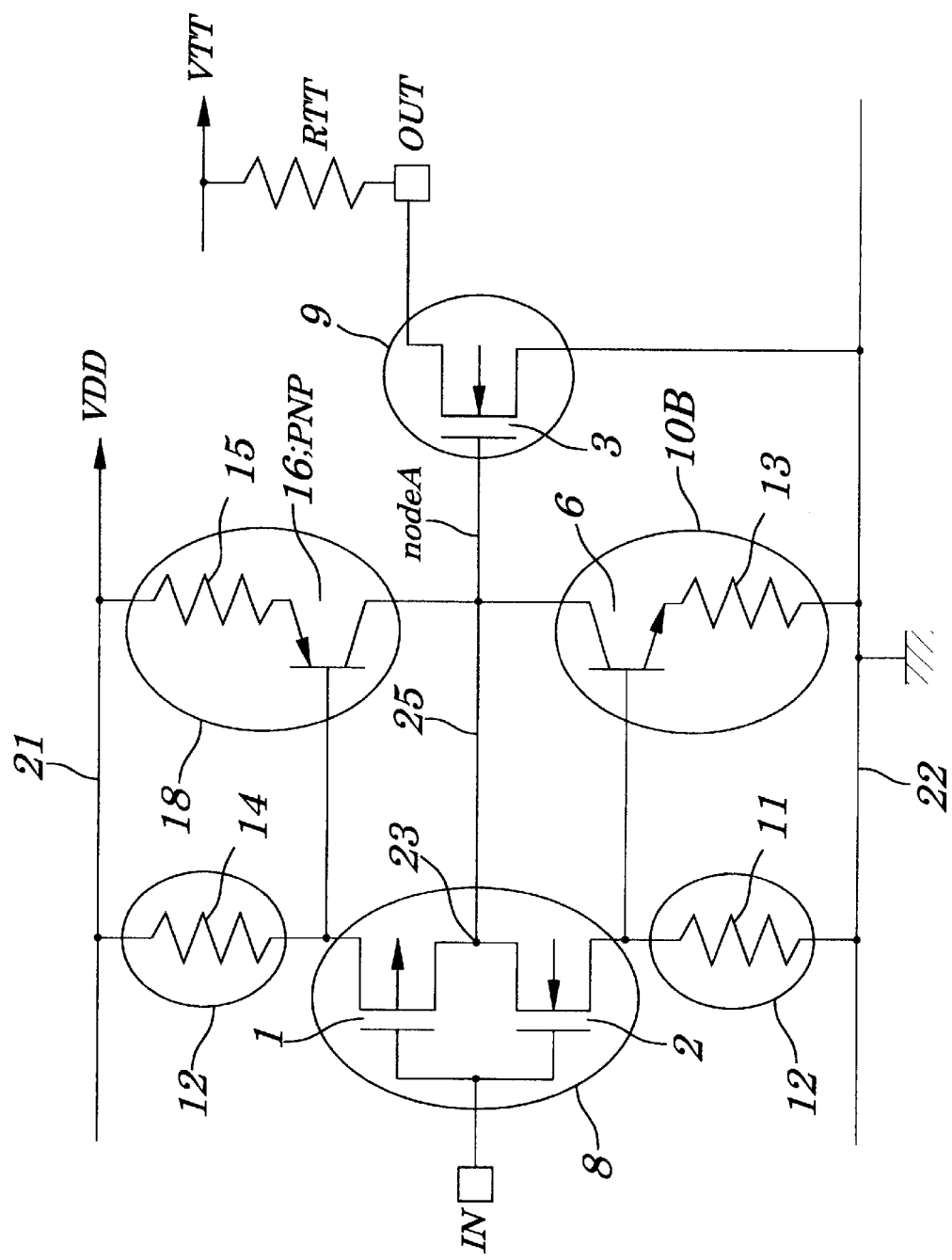
FIG. 4 is a schematic logical circuit diagram for implementing a transient current producing method, a transient current producing circuit and a semiconductor integrated circuit according to a third embodiment of the present invention.

FIG. 4 is a schematic logical circuit diagram for implementing a transient current producing method, a transient current producing circuit, a semiconductor integrated circuit and logical circuits according to a third embodiment of the present invention.

The object of the first and second embodiments described above is to achieve a high-speed switching of the NMOS transistor to the OFF state. According to the third embodiment shown in FIG. 4, high-speed switching of the NMOS transistor to not only the OFF state but also to the ON state can be implemented. As shown in FIG. 4, according to the third embodiment, a second transient voltage producing circuit 12 composed of a resistor 14 disposed between a source of the PMOS transistor 1 and the power supply terminal and a second current amplifying circuit 18 composed of a resistor 15 and a PNP transistor 16 are additionally provided. The resistor 15 is connected to the PNP transistor in series. A collector of the PNP transistor 16 constituting the second current amplifying circuit 18 is connected to the node A, its emitter is connected to the power supply terminal VDD through the resistor 15 and its base is connected to a connection point to which one end of the resistor 14 and the source of the PMOS transistor 1 are connected.

Figure 5:
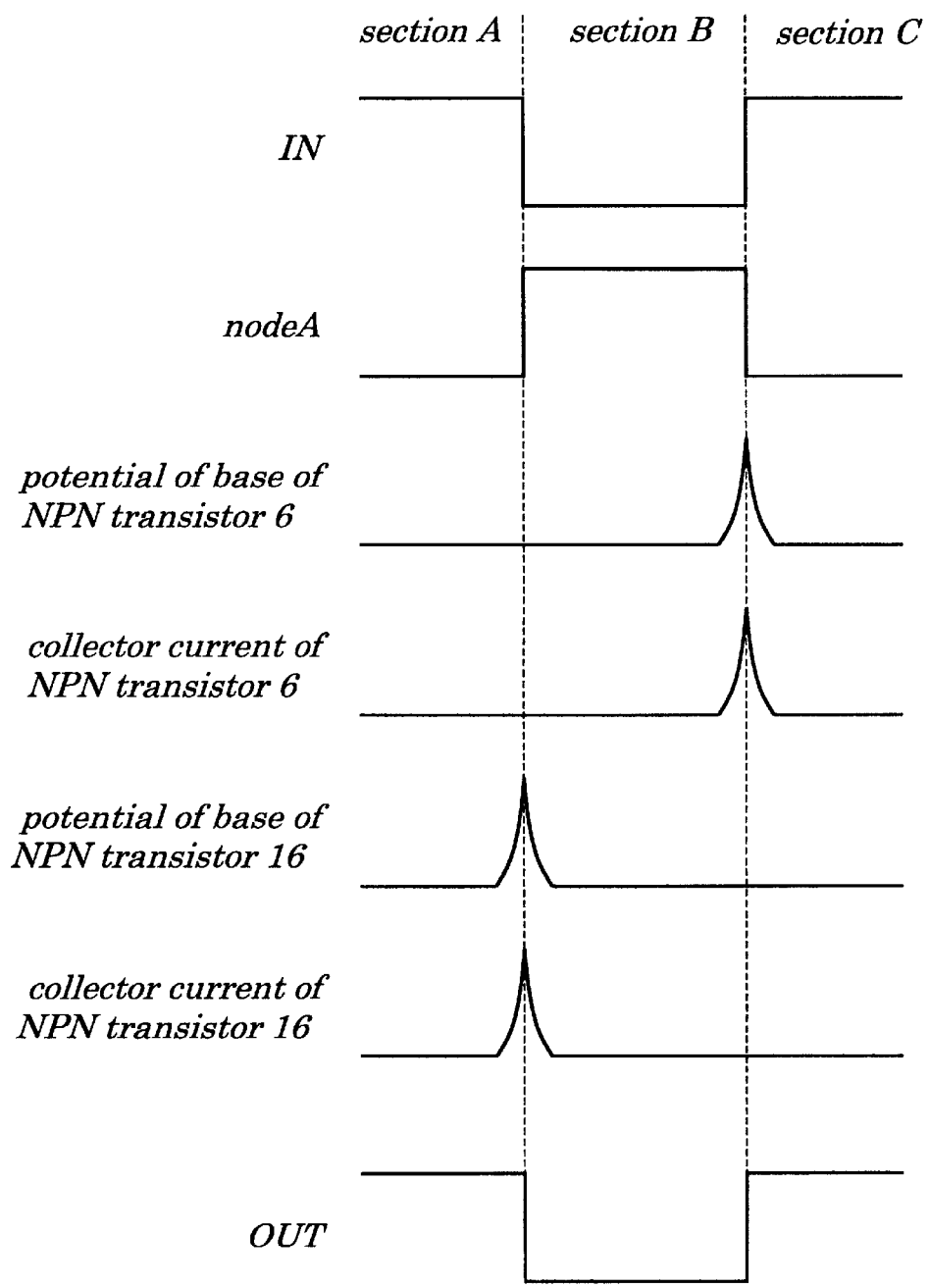
FIG. 5 is a timing chart showing operations of the logical circuits according to the third embodiment of the present invention.

FIG. 5 is a timing chart showing operations of the logical circuits constituting the transient current producing circuits 10B and 18. The configuration of the circuits of the third embodiment in FIG. 4 is the same as those of the first and second embodiments in FIGS. 1 and 3 except the newly added resistor 13, the resistor 15 and the PNP transistor 16. Referring to FIG. 5, while an input IN is at the same potential as the voltage VDD and is at a high level, an output (node A) of the CMOS transistor 8 is at the same potential as a ground potential and at a low level during a section A. At this point, the PNP transistor 16 is in an OFF state.

Since the NMOS transistor 3 remains OFF, an output OUT is at the same potential as a terminating power supply VTT and at a high level. Next, when the level of the input IN becomes low during the section B, since the PMOS transistor 1 changes to its ON state, the PMOS transistor 1 supplies an electric charge from the terminal of the power supply VDD to the node A, causing the node A to be changed to its high level. At this point, a transient current produced by the electric charge supplied by the PMOS transistor 1 flows through the resistor 14, resulting supply of a transient voltage to a base of the PNP transistor 16.

These operations cause the PNP transistor 16 to momentarily pass a current and to rapidly change the NMOS transistor 3 to its ON state. After that, if the input IN is changed again to its high level during a section C, the PMOS transistor 1 changes to its OFF state, the NMOS transistor 2 changes to its ON state and the NMOS transistor 3 changes to its OFF state. As described above, the operation of the transient amplifying circuit 10B performed at this time causes the NMOS transistor 3 to more rapidly change to its OFF state.

The time during which a current passes through the PNP transistor 16 is just a moment between the section A and the section B. The momentary transient current can be set to any value by calibrating the resistance of the resistors 14 and 15 and the influence of variations in the resistance of the resistors 14 and 15 can be removed in the same manner as in the first and second embodiments.

Fourth Embodiment

Figure 6:
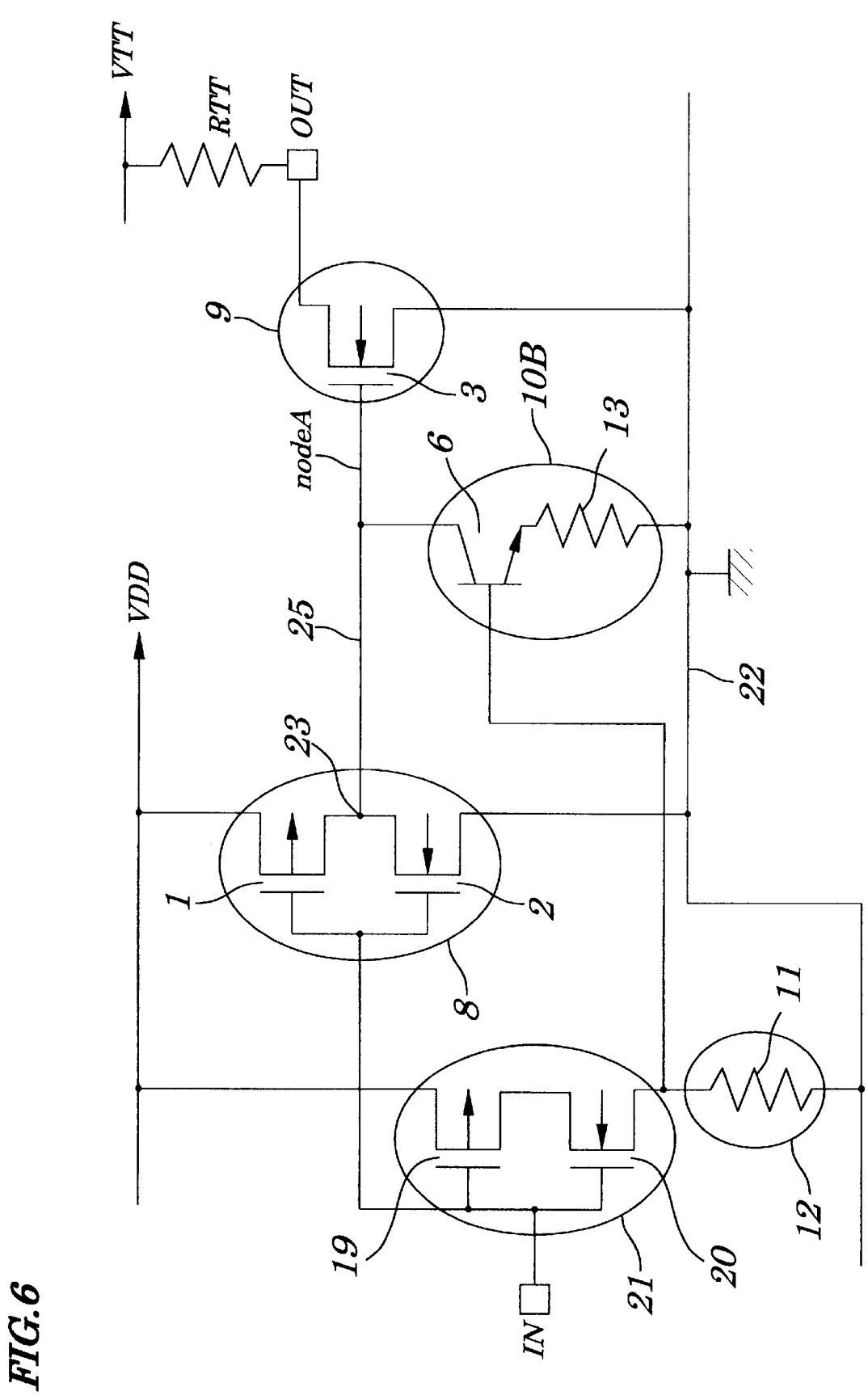
FIG. 6 is a schematic logical circuit diagram for implementing a transient current producing method, a transient current producing circuit and a semiconductor integrated circuit according to the third embodiment of the present invention.
Figure 7:
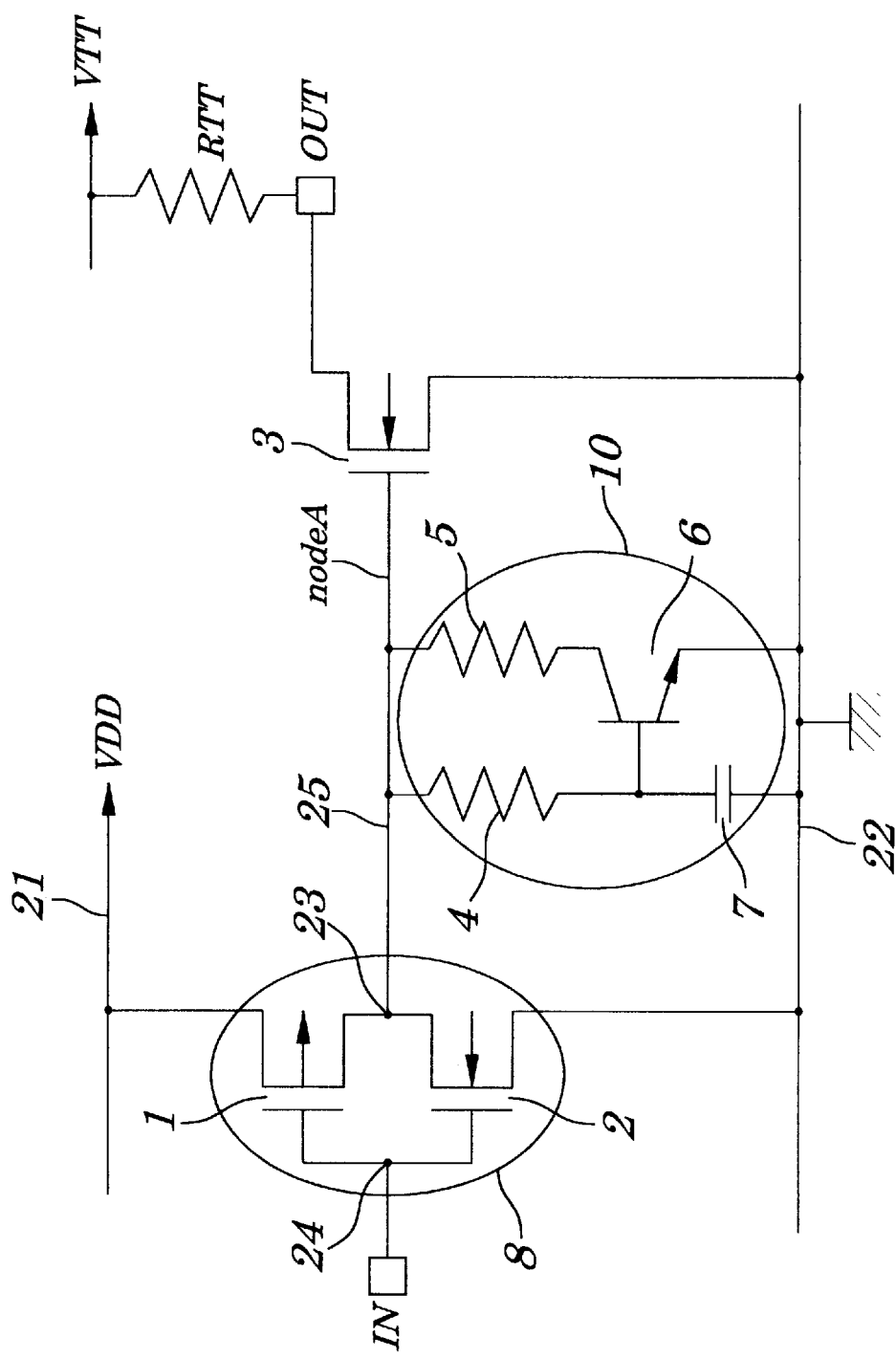
FIG. 7 is a conventional schematic logical circuit diagram for implementing a transient current producing method, a transient current producing circuit and a semiconductor integrated circuit.
Figure 8:
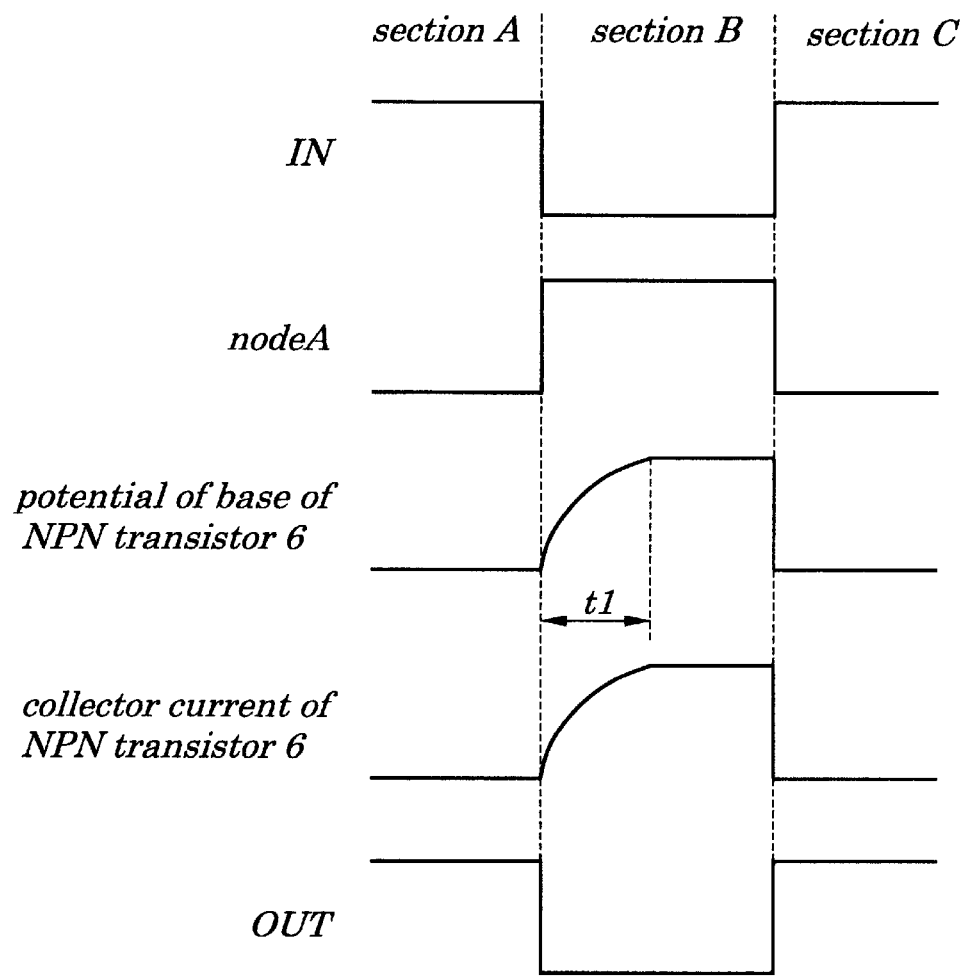
FIG. 8 is a timing chart showing operations of conventional logical circuits of FIG. 7.

FIG. 6 is a schematic logical circuit diagram for implementing a transient current producing method, a transient current producing circuit and a semiconductor integrated circuit according to a fourth embodiment of the present invention. In this embodiment, a transient voltage producing circuit 12 is composed of a PMOS transistor 19, a NMOS transistor 20 and a resistor 11. Since the gates of the PMOS transistor 19 and the NMOS transistor 20 are connected in common to the input IN, the timing with which the transient voltage is produced and the amplified transient current is produced of this embodiment is the same as shown in the timing chart in FIG. 2. According to this embodiment, since the transient voltage producing circuit 12 is constructed independently of the CMOS circuit 8, an amount of transient voltage can be adjusted more properly.

It is apparent that the present invention is not limited to the above embodiments but may be changed and modified without departing from the scope and spirit of the invention. For example, the transient voltage producing circuit 12 may be configured in a different manner as shown in FIG. 6. Moreover, instead of the resistor, for example, a MOS transistor may be used in the circuit. In this case, if the MOS transistor is used instead of the resistors 11 or 13, the source and drain of the NMOS transistor with its gate connected to the terminal of the power supply VDD may be used for each end of the resistor. If the MOS transistor is used instead of the resistors 14 or 15, the source and drain of the PMOS transistor with its gate connected to the ground may be used for each end of the resistor. Furthermore, the PMOS transistor may be used instead of the NMOS transistor 3 and the NPN or PNP transistor may be also used instead of the NMOS transistor 3. Instead of the NPN transistor 6, the NMOS transistor may be used. Instead of the PNP transistor 16, the PMOS transistor may be used as well.

Thus, in the transient current producing method, transient current producing circuit, semiconductor integrated circuit and logical circuits of the present invention, since the CMOS circuit is adapted to convert the transient current produced when the CMOS circuit is switched to the transient voltage and the transient current is amplified to a predetermined value, the switching of the transistor even having large device areas can be speeded up and, since the transient current producing circuit is operated only at the time of switching, the reduction in the power consumption can be achieved.

It is thus apparent that the present invention is not limited to the above embodiments but may be changed and modified without departing from the scope and spirit of the invention.

Finally, the present application claims the priority of Japanese Patent Application No. Hei11-022764 filed on Jan. 29, 1999, which is herein incorporated by reference.

What is claimed is:

1. A transient current producing circuit comprising:

a CMOS circuit;

a transient voltage converting means for converting a transient current occurring at the time of switching of said CMOS circuit to a transient voltage; and a transient current producing means for converting said transient voltage to the transient current having a predetermined value and for amplifying said current, wherein said transient voltage converting means is a resistor or a resistance component of a transistor against conduction.

2. A transient current producing circuit comprising:

a CMOS circuit;

a transient voltage converting means for converting a transient current occurring at the time of switching of said CMOS circuit to a transient voltage; and a transient current producing means for converting said transient voltage to the transient current having a predetermined value and for amplifying said current, wherein an output signal of said transient voltage converting means is fed TO an input terminal of said transient current producing means and an output terminal of said transient current producing means is connected through a resistor to a power supply or a ground and said amplified transient current is outputted from said output terminal.

3. A transient current producing circuit comprising:

a CMOS circuit;

a transient voltage converting means for converting a transient current occurring at the time of switching of said CMOS circuit to a transient voltage; and a transient current producing means for converting said transient voltage to the transient current having a predetermined value and for amplifying said current, wherein an output signal of said transient voltage converting means is fed to an input terminal of said transient current producing means and wherein an output terminal of said transient current producing means is connected to one of a power supply and a ground and wherein said amplified transient current is outputted from said output terminal, wherein said transient current producing means is provided with a bipolar transistor and a base of said bipolar transistor is used as an input of said transient current producing means and an emitter of said bipolar transistor is connected through a resistor to one of said power supply and said ground.

4. A transient current producing circuit comprising:

a CMOS circuit;

a transient voltage converting means for converting a transient current occurring at the time of switching of said CMOS circuit to a transient voltage; and a transient current producing means for converting said transient voltage to the transient current having a predetermined value and for amplifying said current, wherein an output signal of said transient voltage converting means is fed to an input terminal of said transient current producing means and wherein an output terminal of said transient current producing means is connected to one of a power supply and a ground and wherein said amplified transient current is outputted from said output terminal, wherein said transient current producing means is provided with a bipolar transistor and a gate of a unipolar transistor receives an input from said CMOS circuit, a drain of said unipolar transistor is used as said output from said CMOS circuit and a source of said unipolar transistor is connected to ground.

5. A transient current producing circuit comprising:

a first CMOS circuit;

a transient voltage converting means for converting a first transient current to a transient voltage, a transient current amplifying means for converting said transient voltage to a second transient current having a predetermined value and for amplifying said second transient current; and a second CMOS circuit and wherein said transient voltage converting means is used to convert said first transient current flowing through said second CMOS circuit which is switched at a same time or at almost a same time when said first CMOS circuit is switched, to the transient voltage.

6. A transient current producing circuit comprising:

a first CMOS circuit;

a transient voltage converting means for converting a first transient current to a transient voltage; and a transient current amplifying means for converting said transient voltage to a second transient current having a predetermined value and for amplifying said second transient current, wherein said transient voltage converting means is provided with a resistor connected between a second CMOS circuit and a power supply.

7. The transient current producing circuit according to claim 6, wherein said resistor is a resistor device or a resistance component of a transistor against conduction.

8. A transient current producing circuit comprising:

a first CMOS circuit;

a transient voltage converting means for converting a first transient current to a transient voltage; and a transient current amplifying means for converting said transient voltage to a second transient current having a predetermined value and for amplifying said second transient current, wherein said transient voltage converting means is provided with a resistor connected between said first CMOS circuit and ground.

9. A transient current producing circuit comprising:

a first CMOS circuit;

a transient voltage converting means for converting a first transient current when said first CMOS circuit is switched to a transient voltage; and a transient current amplifying means for converting said transient voltage to a second transient current having a predetermined value and for amplifying said second transient current, wherein an output signal of said transient voltage producing means is fed to an input terminal of said transient current amplifying means and an output terminal of said transient current amplifying means is connected through a resistor to a power supply or a ground and said amplified transient current is outputted from said output terminal.

10. A transient current producing circuit comprising:

a first CMOS circuit;

a transient voltage converting means for converting a first transient current to a transient voltage; and a transient current amplifying means for converting said transient voltage to a second transient current having a predetermined value and for amplifying said second transient current wherein an output signal of said transient voltage producing means is fed to an input terminal of said transient current amplifying means and an output terminal of said transient current amplifying means is connected through a resistor to a power supply or a ground and said amplified transient current is outputted from said output terminal, wherein said transient current amplifying means is provided with a bipolar transistor and a base of said bipolar transistor is used as an input of said transient current amplifying means and an emitter of said bipolar transistor is connected through a resistor to said power supply or said ground.

11. A semiconductor integrated circuit comprising:

a first CMOS circuit;

a transient voltage producing means for converting a transient current occurring at the time of switching of said first CMOS circuit to a transient voltage;

a transient current amplifying means for receiving said transient voltage and amplifying transient current to a predetermined value; and logical circuit to receive an output signal from said first CMOS circuit and an output signal from said transient current amplifying means.

12. The semiconductor integrated circuit according to claim 11, wherein said transient voltage producing means is connected between said first CMOS circuit and a power supply.

13. The semiconductor integrated circuit according to claim 11, wherein said transient voltage producing means is connected between said first CMOS circuit and a ground.

14. The semiconductor integrated circuit according to claim 11, wherein said transient voltage producing means is a resistor device or a resistance component of a transistor.

15. The semiconductor integrated circuit according to claim 11, wherein said logical circuit is formed by a bipolar transistor.

16. A semiconductor integrated circuit comprising:

a first CMOS circuit;

transient voltage producing means for converting a transient current to a transient voltage;

transient current amplifying means for receiving said transient voltage and amplifying said transient current to a predetermined value; and logical circuit to receive an output signal from said first CMOS circuit and an output signal from said transient current amplifying means.

17. The semiconductor integrated circuit according to claim 16, further comprising a second CMOS circuit and wherein said transient voltage producing means is used to convert a transient current flowing through said second CMOS circuit which is switched at the same time or at almost the same time when said first CMOS circuit is switched, to a transient voltage.

18. The semiconductor integrated circuit according to claim 17, wherein both said first CMOS circuit and said second CMOS circuit are disposed on the same chip formed on the same substrate.

19. The semiconductor integrated circuit according to claim 16, wherein said transient voltage producing means is provided with a resistor connected between a second CMOS circuit and a power supply.

20. The semiconductor integrated circuit according to claim 16, wherein said transient voltage producing means is provided with a resistor connected between a second CMOS circuit and a ground.

21. The semiconductor integrated circuit according to claim 20, where an output signal of said transient voltage producing means is fed to an input terminal of said transient current amplifying means, an output terminal of said transient current amplifying means is connected to one of a power supply or said ground and a amplified transient current is outputted from a output terminal.

22. The semiconductor integrated circuit according to claim 20, where an output signal of said transient voltage producing means is fed to an input terminal of said transient current amplifying means, an output terminal of said transient current amplifying means is connected through said resistor to a power supply or said ground and said amplified transient current is outputted from an output terminal.

23. The semiconductor integrated circuit according to claim 22, wherein said transient current amplifying means is provided with a bipolar transistor and a base of said bipolar transistor is used as an input of said transient current amplifying means, a collector of a bipolar transistor is used as an output of said transient current amplifying means and an emitter of said bipolar transistor is connected through said resistor to said power supply or said ground.

24. The semiconductor integrated circuit according to claim 22, wherein a second CMOS circuit is provided with a unipolar transistor and a gate os said unipolar transistor is used to receive an input from said transient current amplifying means, a drain of said unipolar transistor is used as an output of said second CMOS circuit and a source of said unipolar transistor is connected to ground.

25. The semiconductor integrated circuit according to claim 16, wherein a resistor is a resistor device or a resistance component of a transistor.

26. The semiconductor integrated circuit according to claim 16, wherein said logical circuit is said CMOS circuit formed by a unipolar transistor.

27. The semiconductor integrated circuit according to claim 16, wherein said logical circuit is formed by a bipolar transistor.

28. A logical circuit for forming a logical signal used for producing transient current comprising a transistor used to amplify a reaction current occurring at a time of switching and to discharge it, comprising:

a voltage circuit connected to said transistor to produce said reaction current generated at the time of switching of said transistor;

an amplifying means for amplifying said reaction current produced by a reaction voltage;

a first resistor to produce said reaction voltage;

a second resistor contained in said amplifying means;

whereby said first and second resistors are connected to a terminal having a same potential and wherein a relation between a resistance R1 of said first resistor and a resistance R2 of said second resistor is able to be expressed in following formula:

$$R1 = \alpha \cdot R2$$

where a represents a constant value at which said transient current value being a discharging value does not vary due to changes of resistance.

29. The logical circuit according to claim 28, wherein said first and second resistors are disposed in proximity to each other on the same chip.

* * * * *